United States Patent [19]

Posse

[11] Patent Number: 5,544,175

[45] Date of Patent: Aug. 6, 1996

[54] METHOD AND APPARATUS FOR THE CAPTURING AND CHARACTERIZATION OF HIGH-SPEED DIGITAL INFORMATION

[75] Inventor: Kenneth E. Posse, Fort Collins, Colo.

[73] Assignee: Hewlett-Packard Company, Palo Alto, Calif.

[21] Appl. No.: 213,783

[22] Filed: Mar. 15, 1994

[51] Int. Cl.$^6$ ............................................. G01R 31/3143
[52] U.S. Cl. ....................... 371/25.1; 371/22.1; 371/21.2; 371/21.4
[58] Field of Search .................................... 364/486, 579; 324/73.1; 371/23.1, 6, 22.1, 21.1, 21.2–.4, 21.6; 326/93; 327/74, 76, 77, 91, 276

[56] References Cited

U.S. PATENT DOCUMENTS

| | | | |
|---|---|---|---|
| 4,327,440 | 4/1982 | Furuya et al. | 371/6 |
| 4,435,658 | 3/1984 | Murray et al. | 327/76 |
| 4,438,404 | 3/1984 | Philipp | 328/63 |
| 4,456,992 | 6/1984 | Schaub | 371/6 |
| 4,495,621 | 1/1985 | Nakagomi et al. | 371/6 |
| 4,528,591 | 7/1985 | Liepe et al. | 327/76 |
| 4,797,621 | 1/1989 | Anderson et al. | 324/533 |
| 4,817,033 | 3/1989 | Koya | 364/900 |
| 4,819,081 | 4/1989 | Volk et al. | 328/134 |
| 4,888,588 | 12/1989 | Castagnozzi | 341/122 |
| 4,965,800 | 10/1990 | Farnbach | 371/22.1 |
| 5,056,094 | 10/1991 | Whetsel | 371/25.1 |
| 5,144,225 | 9/1992 | Talbot et al. | 324/73.1 |
| 5,144,525 | 9/1992 | Saxe et al. | 365/45 |
| 5,173,906 | 12/1992 | Dreibelbis et al. | 371/25.1 |
| 5,210,486 | 5/1993 | Wilson et al. | 324/158 |
| 5,225,776 | 7/1993 | Dobos et al. | 324/121 |
| 5,230,067 | 7/1993 | Buch | 395/275 |
| 5,305,329 | 4/1994 | Sasahi | 371/22.1 |
| 5,315,599 | 5/1994 | Chaboud et al. | 371/25.1 |
| 5,336,944 | 8/1994 | Fischer | 327/77 |

OTHER PUBLICATIONS

Cable Testing With Time Domain Reflectometry, (Hewlett–Packard Application Note 67, Oct. 1965).

Extending Frequency Range and Increasing Effective Sample Rate on the 5180A Waveform Recorder, (Hewlett–Packard Application Note 313–4).

Model 1415A Time Domain Reflectometer (Hewlett–Packard Operating and Service manual, Apr. 1965).

*Primary Examiner*—Emanuel T. Voeltz
*Assistant Examiner*—Hal D. Wachsman

[57] ABSTRACT

A digital signal detector for sampling the state of a high speed digital signal occurring at a test node in a digital circuit which exhibits the same behavior with repeated applications of the same inputs. The digital signal detector samples the state of a test circuit node at discrete intervals in time and stores the digital levels with timing reference information. The stored information is then compared to the expected behavior of the tested node for analysis of delay-type and other parametric faults, such as performance faults. The digital signal detector includes a state discriminator which determines the state of the input digital signal by comparing its voltage level to one or more threshold voltages. The digital signal detector also includes a memory unit which stores the signal state information upon receipt of a memory strobe signal generated by a memory delay control circuit which delays the application of the memory strobe signal by a predetermined amount of time after the receipt of a clock pulse. The stored digital signal states can be later retrieved from the memory unit for evaluation of the input digital signal.

20 Claims, 7 Drawing Sheets

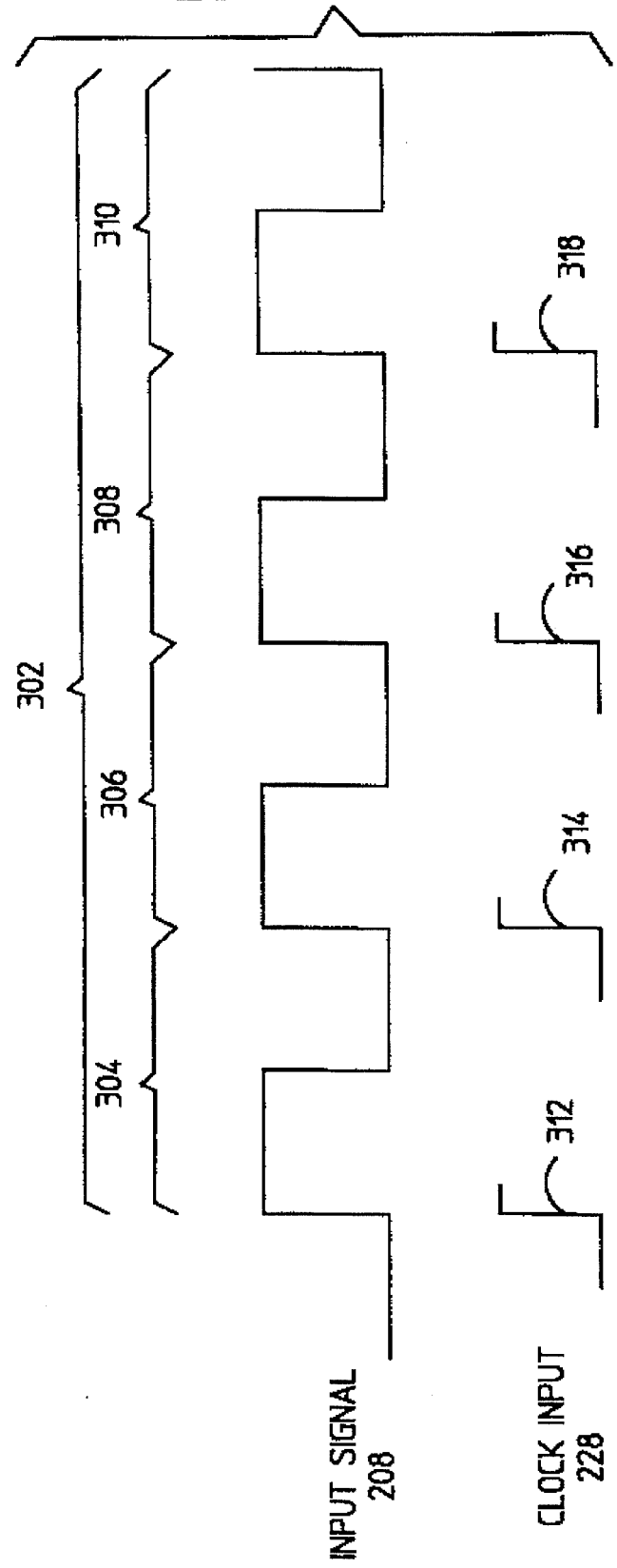

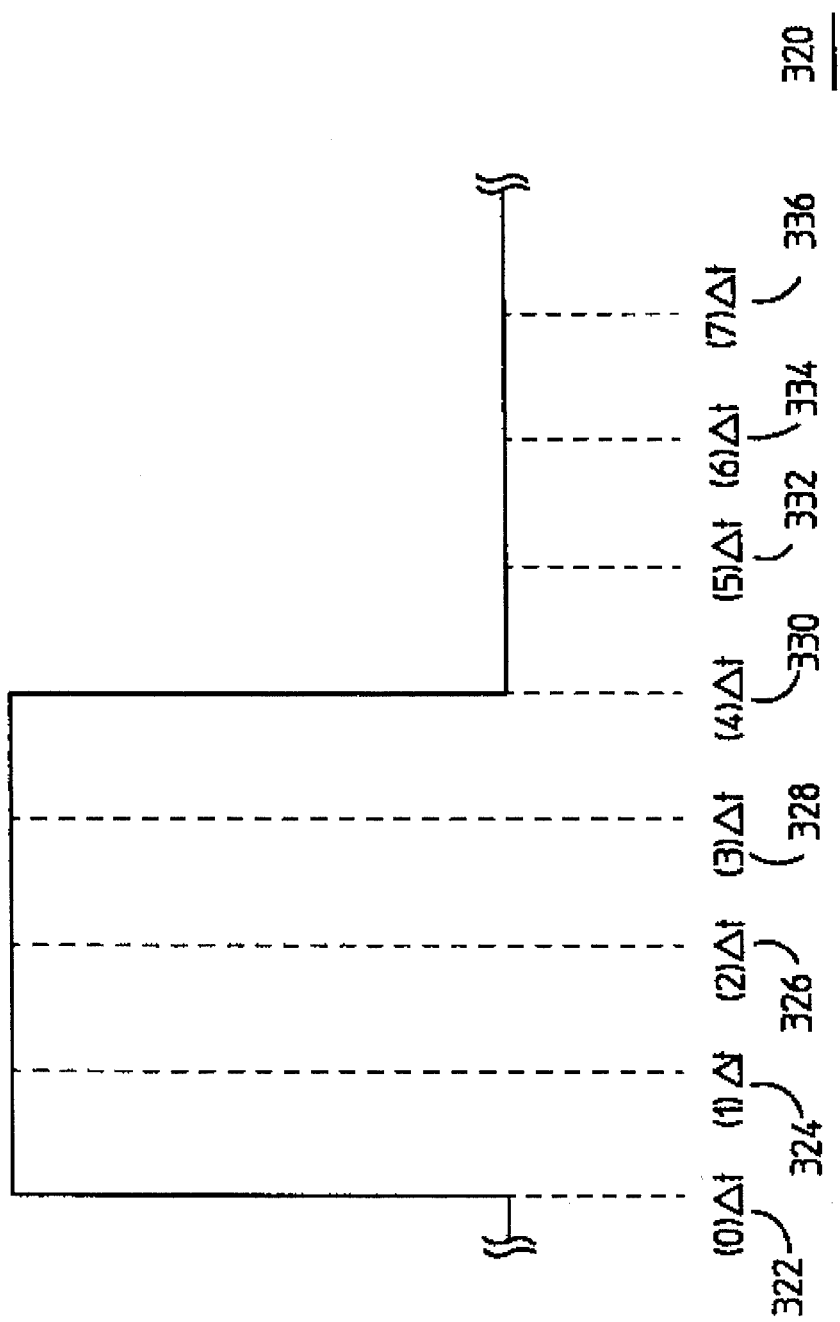

| COL → | 1 | 2 | 3 | 4 | 5 | 6 | 7 |
|---|---|---|---|---|---|---|---|
| | | | | ADDRESS INPUT | | MEMORY LOCATION | |
| ROW ↓ | TEST PERIOD | INPUT SIGNAL PERIOD | DELAY | HIGH ORDER BITS (X=2) | LOW ORDER BITS (Y=3) | BINARY | DECIMAL |
| 1 | 1 | 1(304) | (0)Δt | 00 | 000 | 00000 | 0 |
| 2 | 2 | 1(304) | (1)Δt | 00 | 001 | 00001 | 1 |
| 3 | 3 | 1(304) | (2)Δt | 00 | 000 | 00010 | 2 |
| 4 | 4 | 1(304) | (3)Δt | 00 | 001 | 00011 | 3 |
| 5 | 5 | 1(304) | (4)Δt | 00 | 000 | 00100 | 4 |
| 6 | 6 | 1(304) | (5)Δt | 00 | 001 | 00101 | 5 |
| 7 | 7 | 1(304) | (6)Δt | 00 | 000 | 00110 | 6 |
| 8 | 8 | 1(304) | (7)Δt | 00 | 001 | 00111 | 7 |
| 9 | 1 | 2(304) | (0)Δt | 01 | 000 | 01000 | 8 |
| 10 | 2 | 2(304) | (1)Δt | 01 | 001 | 01001 | 9 |
| 11 | 1 | 2(304) | (2)Δt | 01 | 000 | 01010 | 10 |
| 12 | 2 | 2(304) | (3)Δt | 01 | 001 | 01011 | 11 |
| 13 | 1 | 2(304) | (4)Δt | 01 | 000 | 01100 | 12 |
| 14 | 2 | 2(304) | (5)Δt | 01 | 001 | 01101 | 13 |
| 15 | 1 | 2(304) | (6)Δt | 01 | 000 | 01110 | 14 |
| 16 | 2 | 2(304) | (7)Δt | 01 | 001 | 01111 | 15 |

| | | | | | | |
|---|---|---|---|---|---|---|
| 17 | 1 | 3(304) | (0)Δt | 10 | 000 | 00000 | 16 |
| 18 | 2 | 3(304) | (1)Δt | 10 | 001 | 00001 | 17 |
| 19 | 1 | 3(304) | (2)Δt | 10 | 000 | 00000 | 18 |
| 20 | 2 | 3(304) | (3)Δt | 10 | 001 | 00001 | 19 |
| 21 | 1 | 3(304) | (4)Δt | 10 | 000 | 00000 | 20 |
| 22 | 2 | 3(304) | (5)Δt | 10 | 001 | 00001 | 21 |
| 23 | 1 | 3(304) | (6)Δt | 10 | 000 | 00000 | 22 |
| 24 | 0 | 3(304) | (7)Δt | 11 | 001 | 00001 | 23 |
| 25 | 1 | 4(304) | (0)Δt | 11 | 000 | 11000 | 24 |
| 26 | 2 | 4(304) | (1)Δt | 11 | 001 | 11001 | 25 |
| 27 | 3 | 4(304) | (2)Δt | 11 | 010 | 11010 | 26 |
| 28 | 4 | 4(304) | (3)Δt | 11 | 011 | 11011 | 27 |
| 29 | 5 | 4(304) | (4)Δt | 11 | 001 | 11100 | 28 |
| 30 | 6 | 4(304) | (5)Δt | 11 | 101 | 11100 | 29 |
| 31 | 7 | 4(304) | (6)Δt | 11 | 110 | 11101 | 30 |
| 32 | 8 | 4(304) | (7)Δt | 11 | 111 | 11111 | 31 |

⇦ FROM FIG 4A

FIG 4B

METHOD AND APPARATUS FOR THE CAPTURING AND CHARACTERIZATION OF HIGH-SPEED DIGITAL INFORMATION

BACKGROUND OF THE INVENTION

1. Field of the Invention

The present invention relates generally to electrical circuits, and more particularly, to a method and apparatus for testing the operation of digital circuits.

2. Related Art

The speed of today's data processors, and the complex digital circuits they contain, make detecting and resolving circuit errors difficult. Unlike the ability of logic synthesis software tools to resolve logic errors, circuit errors due to circuit designs, manufacturing flaws, and the like are not easily solved.

A fault may cause an error in computing when a digital component, such as an AND gate or a flip-flop, assigns an improper binary value to a signal at an input, referred to as voltage threshold fault. For example, a "one" is assigned instead of a "zero" or vice versa. A digital circuit will recognize a "one" if the sampled signal is above a certain predefined threshold voltage level; in this case, the signal is said to be in a "high" state. Similarly, a "zero" will be recognized if the sampled signal voltage is less than a lower predetermined threshold voltage level; in this case, the signal is said to be in a "low" state. If the signal is in a voltage range lying between the high and low states, the signal is said to be in an "intermediate" state.

Besides voltage threshold faults, digital components also experience what is referred to as performance faults. A performance fault is a defect in digital component which causes it to exhibit a propagation delay in excess of the circuit design limits. Conventional circuit testers have been particularly unsuccessful in obtaining the necessary digital signal information to perform the proper diagnoses of a digital circuit having components which are experiencing performance-type faults.

Two conventional techniques used by circuit testers to gather digital signal information from the device under test (DUT) for fault determination and analysis are known as the window compare technique and edge compare technique.

A circuit tester utilizing the window compare technique determines whether a digital signal stays either above or below predetermined voltage threshold levels while the "window" is open. This is typically used to verify that the sampled digital signal remains valid for some nominal time duration marked by the points in time when the window opens and closes. The problem with the window compare technique is that it only determines whether a threshold crossing has occurred. It does not determine the point in time of this threshold crossing occurrence. Without this information, performance-type errors cannot be detected.

In contrast to the window compare technique, devices utilizing the edge compare technique sample the digital signal occurring at a test node of a DUT during a very brief period of time. The sampled digital signal data is used to characterize the information which occurs at the test node during the entire clock cycle in which the sampling occurred. The difficulty with this technique is that very little information is sampled for a particular test node per clock cycle. Another disadvantage of the edge compare technique is its inability to continually sample and store the digital signal state occurring at the test node for diagnosis of performance errors.

While the above conventional techniques have proven to be generally effective in the diagnosis of certain types of digital circuit problems, they have been particularly ineffective in detecting and gathering data necessary for the diagnosis of performance faults in a DUT. What is needed is a digital signal detector which samples and stores a sufficient amount of digital signal data for proper identification and analysis of performance faults in digital circuits and their components.

SUMMARY OF THE INVENTION

The present invention is a digital signal detector for sampling the state of a high speed digital signal occurring at a test node in a digital circuit which exhibits the same behavior with repeated applications of the same inputs. The digital signal detector of the present invention samples the state of a test circuit node at discrete intervals in time and stores the digital levels with timing reference information. The stored information is then compared to the expected behavior of the tested node for analysis of delay-type and other parametric faults, such as performance faults.

The digital signal detector of the present invention includes a state discriminator which determines the state of the input digital signal by comparing its voltage level to one or more threshold voltages. The state discriminator generates one or more signal state outputs corresponding to each of the possible digital signal states.

The digital signal detector also includes a memory unit which receives the signal state outputs from the state discriminator and stores the signal states upon receipt of a memory strobe signal. The memory strobe signal is generated by a memory delay control circuit which delays the application of the memory strobe signal by a predetermined amount of time after the receipt of a clock pulse. The signal state outputs are then stored at memory locations in the memory unit so that the stored portions can be later retrieved from the memory unit for evaluation of the input digital signal.

BRIEF DESCRIPTION OF THE FIGURES

The invention is best understood by reference to the Figures wherein references with like reference numbers indicate identical or functionally similar elements. In addition, the left-most digits refers to the figure in which the reference first appears in the accompanying drawings in which:

FIG. 3A is a graphical illustration of a test period of a digital input signal having four periods;

FIG. 3B is a graphical illustration of a single period of a digital input signal divided into eight sampled portions, each located at successive increments of a discrete unit of time from the associated clock pulse;

FIG. 4 is a representative chart of the memory allocation for each of the sampled portions of the digital signal periods which comprise the test period illustrated in FIG. 3A.

DETAILED DESCRIPTION OF THE PREFERRED EMBODIMENTS

I. Introduction

The present invention is a digital signal detector for capturing the state of a high speed digital signal at a test node within a digital circuit for the identification of parametric defects. The digital signal detector of the present invention samples a digital signal occurring at the node in such a manner that the sampled state data can be compared to the expected behavior of the test node for the signal inputs provided to the digital circuit. This allows for the identification and analysis of any errant behavior of the digital circuit, such as performance faults or other propagation delay defects.

Figure 1:
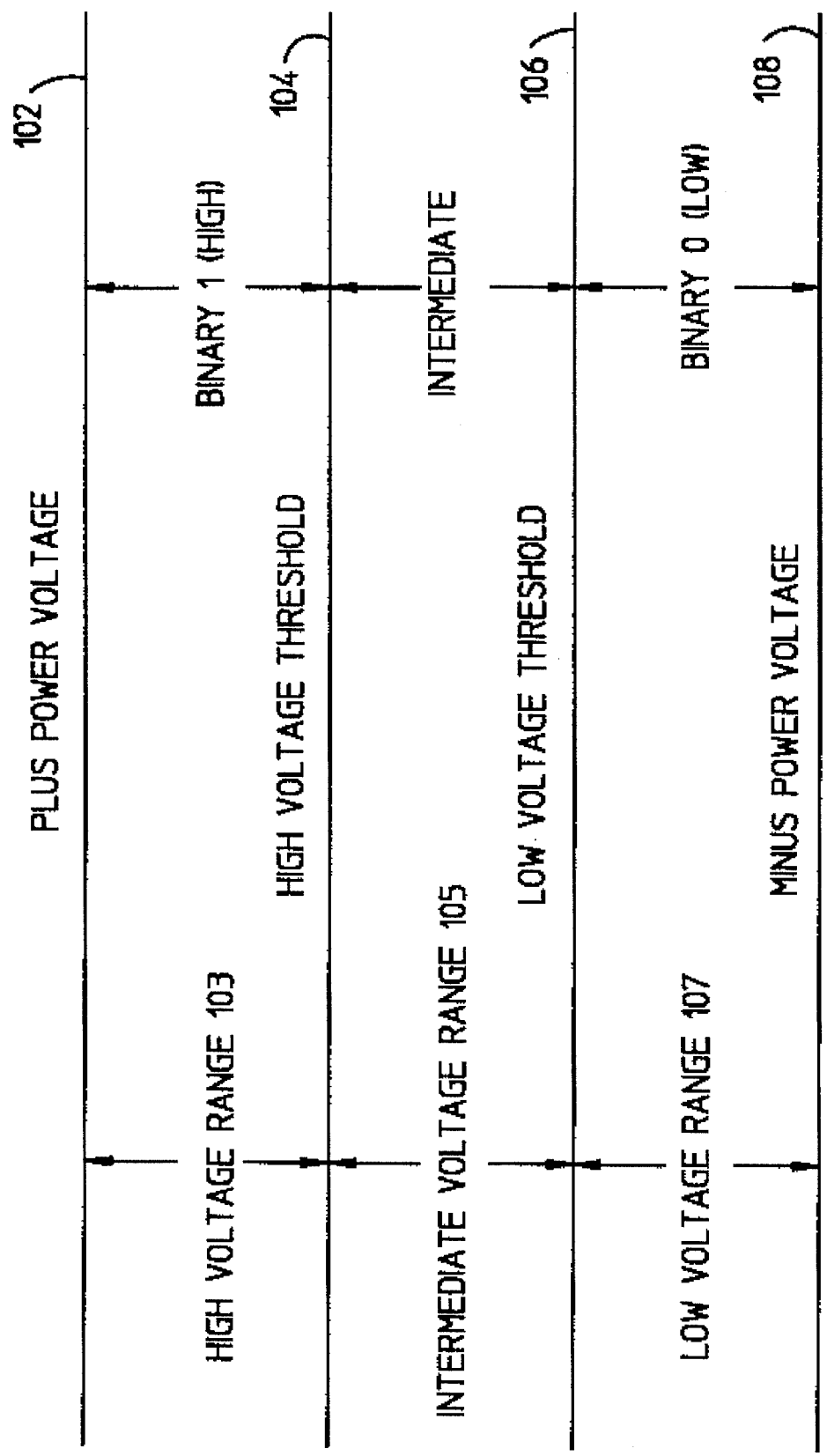
FIG. 1 is a graphical illustration of the various voltage levels recognized by a digital circuit.

FIG. 1 illustrates the relationship in a digital circuit between high and low voltage thresholds. Referring to FIG. 1, it can be seen that any digital input signal having a voltage within the high voltage range 103, above high voltage threshold 104 and below a plus power voltage 102, is associated with a binary "one." Similarly, any signal with a voltage within the low voltage range 107, below a low voltage threshold 106 and above a minus power voltage 108, is associated with a binary "zero." Thus, when a "one" is recognized by a digital component (hereinafter referred to as "component") within the digital circuit, the signal is said to be in the high state 103 ("high"), and when a zero is recognized, the signal is said to be in the low state 107 ("low"). However, the value recognized by the component is uncertain or indeterminate if the signal voltage is above the low voltage threshold 106 and also below the high voltage threshold 104. In that voltage range 105, the signal is said to be in the intermediate state 105. Therefore, a digital signal at any specific point in time will be classified as only one of three states: the high state, the low state, or the intermediate state.

As an illustration of the use of the above terminology, when a digital signal is in the high state, it is said that the specified signal is high. Similarly when a digital signal is in the low state, it is said that the specified signal is low. Also, when a digital signal is in neither the high or low state, it is said that the digital signal is in the intermediate state.

II. Digital Signal Detector

Figure 2:
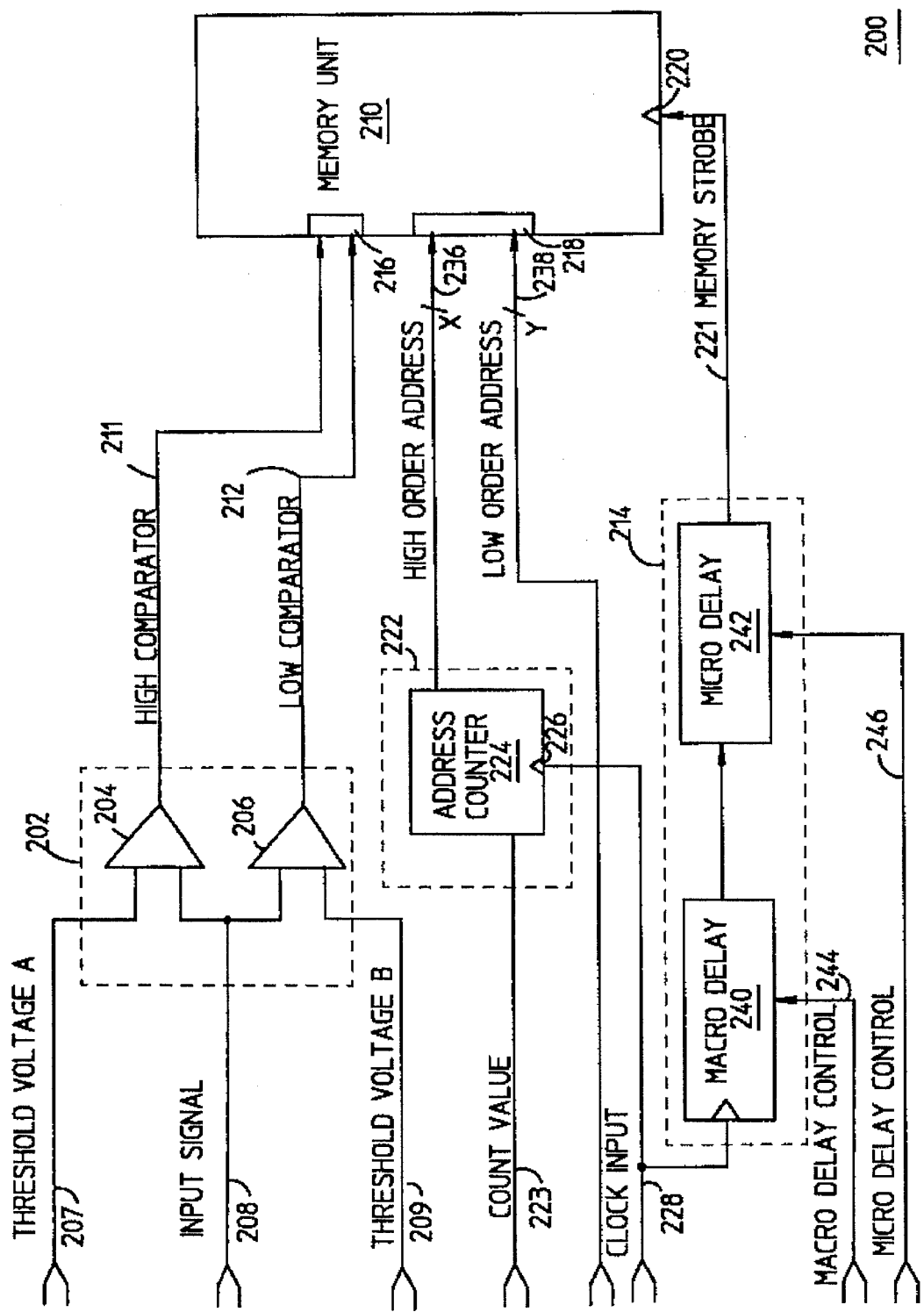
FIG. 2 is a circuit diagram of a preferred embodiment of the digital signal detector of the present invention.

FIG. 2 illustrates a block diagram of a preferred embodiment of the digital signal detector of the present invention, showing the components of the invention and their interconnection. Referring to FIG. 2, a digital signal detector 200 of the present invention comprises an input signal state discriminator 202, a memory unit 210, an address determination circuit 222, and a memory delay control circuit 214. These components work in conjunction with each other to sample and store the state of a digital signal occurring at a circuit node of a device under test (DUT) which is input to the digital signal detector 200 as an input signal 208. It should be noted for purposes of this discussion, that input signal 208 may assume any of a variety of characteristics, and therefore the specific examples chosen for an input digital signal are to be considered exemplary.

A. Input State Discriminator

Referring to FIG. 2, input state discriminator 202 is used to classify input signal 208 within one of the following states: high, low, or intermediate, as described above with reference to FIG. 1. Input state discriminator 202 receives input signal 208 and compares it with two threshold voltages: threshold voltage A and threshold voltage B. Threshold voltage A is input to input state discriminator 202 on a first threshold voltage line 207. Threshold voltage B is provided to input state discriminator 202 on a second threshold voltage line 209. One of the threshold voltages is the high threshold voltage; the other threshold voltage is the low threshold voltage. For example, in a preferred embodiment of the present invention, threshold voltage A corresponds to the high threshold voltage and threshold voltage B corresponds to the low threshold voltage. Using these inputs, input state discriminator 202 provides appropriate output signal lines to indicate the state of input signal 208.

More specifically, within input state discriminator 202, input signal 208 and threshold voltage A are provided as inputs to a first comparator 204. Also, input signal 208 and threshold voltage B are provided as inputs to a second comparator 206. Accordingly, input signal 208 is simultaneously compared with the threshold voltage A in first comparator 204 and threshold voltage B in second comparator 206. When the voltage of input signal 208 is above threshold voltage A, the output of first comparator 204 will be in the high state. When the voltage level of input signal 208 is below threshold voltage A the output of first comparator 204 will be in the low state. Likewise, when the voltage of input signal 208 is above threshold voltage B, the output of second comparator 206 will be in the high state and when the voltage of input signal 208 is below threshold voltage B, the output of second comparator 206 will be in the low state.

In a preferred embodiment of the present invention, the output of first comparator 204 is referred to as the high comparator (HC) line 211 since threshold A corresponds to the high voltage threshold. The output of second comparator 206 is referred to as the low comparator (LC) line 212 since threshold B corresponds to the low voltage threshold. It should be noted that both threshold voltages are preferably generated by any known means so that a user may independently determine the low threshold and the high threshold voltages needed for the particular circuit application. In a preferred embodiment, threshold voltages A and B are generated by any well known programmable voltage reference. It should be apparent that, for purposes of the input signal state discriminator 202, threshold voltage A can represent either the low or high threshold voltage level with threshold voltage B representing the other threshold voltage level.

The outputs of input state discriminator 202, HC signal line 211 and LC signal line 212, together identify whether input signal 208 is above both thresholds (high), between the high and low thresholds (intermediate), or below both thresholds (low). This information is continuously available on HC signal line 211 and LC signal line 212. HC signal line 211 and LC signal line 212 are connected to a data input 216 of memory unit 210. When both, the HC signal line 211 and LC signal line 210 are low, then data input 216 is provided with a "00" input, indicating that input signal 208 is below both threshold voltages, and therefore "low." When both, the HC signal lines 211 and the LC signal line 210 are high, then data input 216 is provided with a "11" input, indicating that input signal 208 is above both threshold voltages, and therefore "high." When the HC signal line 211 is low and the LC signal line 210 is high, then data input 216 is provided with a "01" input, indicating that the input signal 208 is between both threshold voltages, and therefore in the intermediate state. Thus, memory unit 210 is constantly provided with the state of input signal 208 at data input 216. The input signal discriminator 202 described above and illustrated in FIG. 2 is one preferred embodiment of such a device. Other embodiments of discriminator 202 would be apparent to one of ordinary skill in the relevant art.

Since all digital logic families (for example, TTL, ECL, CMOS) have two thresholds, a preferred embodiment of the present invention includes two comparators set at the associated threshold voltages. The specified high threshold and low threshold voltage levels vary depending on the family of components used and the specific application. For example, if the DUT consists of TTL circuits, the high threshold voltage may be +2.2 volts and the low threshold voltage may be +0.8 volts. Alternatively, if the DUT consists of CMOS circuits, the high voltage threshold may be +4.5 volts and the low voltage threshold may be 0.5 volts.

B. Memory Unit

Memory unit 210 has a clock input 220 to receive a memory strobe signal via a memory strobe line 221 (discussed below). Memory unit 210 also has an address input 218 (discussed below) to receive information indicating to which data storage location a sampled digital signal level is to be stored. Memory unit 210 stores the digital signal state received from input state discriminator 202 at data input 216 according to an address command presented on address input 218 when a memory strobe signal is received at clock input 220. Thus, the state of HC signal line 211 and LC signal line 212, which constantly reflect the current state of input signal 208, are sampled and stored in memory unit 210 when memory strobe line 221 provides a memory strobe signal to memory unit 210.

In a preferred embodiment of the present invention, memory unit 210 is a random access memory (RAM). However, implementing memory unit 202 in any known data storage device applicable to a given application is considered to be obvious to one of ordinary skill in the relevant art. For example, memory unit 210 may SRAM, DRAM, FLASH-RAM, etc.

At address input 218, memory unit 210 is coupled to a high order address bus 236 and a low order address bus 238. The high order address bus 238 provides memory unit 210 with a number of "X" high order address bits. The low order address line 234 provides memory unit 210 with a number of "Y" low order address bits. Together, the X high order address bits and the Y low order address bits provide memory unit 210 with a complete address location at which to store the sampled digital signal state received at data input 216 when a memory strobe signal is applied to clock input 220.

C. Address Determination Circuit

Address determination circuit 222 comprises an address counter 224. Address counter 224 is a programmable counter which is programmed to count a predetermined number of clock pulses input at clock input 226 on clock input line 228. The predetermined number of clock pulses is provided to address counter 224 via a count value signal input on count value line 223. As one of ordinary skill in the relevant art would find apparent, address counter 224 may be programmed in any manner, including dip switches, EEPROM, etc. In a preferred embodiment of the present invention, address counter 224 sequences through the number of clock pulses which are generated in a given test period. For example, if data is to be collected for 16 clock cycles, then address counter 224 is required to be at least a 4-bit address counter (since $2^4=16$). The number of clock pulses received on clock input line 228 is represented by the binary value of the "X" high order address bits output on high order address bus 236.

In a preferred embodiment of the present invention, address determination circuit 222 includes a single address counter. However, as one of ordinary skill in the relevant art would find apparent, address determination circuit 222 may be implemented in alternative configurations. As shown in FIG. 2, address determination circuit 222 does not include the standard inputs, such as reset, load, etc. These inputs and their operation are considered to be well known in the art and are thus omitted from FIG. 2 for clarity. It should be noted that address determination circuit 222 may also be implemented with additional or different components to perform similar functions to the low order address bus 238. If, for example, the low order address bit value is incremented every fourth clock pulse (the example provided below), an alternative embodiment of address determination circuit 222 may then include a second programmable address counter which would be coupled to clock input line 228. This second address counter would then be programmed to increment the low order address bit value every fourth clock pulse.

D. Memory Delay Control Circuit

The digital signal detector 200 of the present invention also comprises a memory delay control circuit 214. Memory delay control circuit 214 is coupled to clock input line 228 and memory strobe line 221. Memory delay control circuit 214 receives a clock pulse on clock input line 228 and outputs a memory strobe signal on memory strobe line 221 to memory unit 210 after a delay time period, referred to as $\Delta t$, In other words, memory delay control circuit 214 delays the application of clock input 228, in the form of a memory strobe signal, to memory unit 210.

Memory delay circuit 214 includes a macro delay unit 240 and a micro delay unit 242. Macro delay unit 240 provides the capability to provide coarse time delays to memory strobe signal 221. Micro delay unit 242 provides fine time delays to memory strobe line 221. Memory delay control circuit 214 receives as an input a macro delay control line 244 for control of macro delay unit 240 and a micro delay control line 246 for the control of micro delay unit 242. The macro delay unit 240 and micro delay unit 242 are preferably adjusted by any known means so that a user may independently set the exact delay time period needed for the particular application of digital signal detector 200.

In a preferred embodiment of the present invention, micro delay unit 242 provides a delay which is a multiple of a minimum increment of time, $\Delta t$, at which memory delay control circuit 214 can delay the application of a clock pulse to memory unit 210. The macro delay unit 240 is programmed to provide a delay which is a multiple of a larger increment of time to which the minimum time increment is added. The resulting sum is the total delay time period. For example, if macro delay unit 240 is configured to respond to a 3-bit macro delay control input 244, the resulting duration of the delay time period may be any whole number increment of $\Delta t$ of up to 7 $\Delta t$: $(0)\Delta t, (1)\Delta t, (2)\Delta t, (3)\Delta t, \ldots (7)\Delta t$, since $2^3=8$.

In a preferred embodiment, digital signal detector 200 is implemented with two separate delay units 240 and 242 to achieve a broader range of values by which to delay the application of memory strobe signal to memory unit 210. However, as one of ordinary skill in the relevant art would find apparent, memory delay control circuit 214 may be implemented in a single delay circuit as well as other well known delay circuitry.

In another preferred embodiment of the present invention, memory delay circuit 214 contains a pre-programmed "base" delay. The base delay is equivalent to the total delay which is attributable to the circuit tester components. This enables digital signal detector 200 to calibrate out the effects of the circuit tester (including digital signal detector 200) and thus ensure that the accumulated time-specific information is accurate.

III. Digital Signal Detector Addressing

An address input 218 of memory unit 210 receives high order address bus 236 and low order address bus 238. As discussed above, high order address bus 236 provides memory unit 210 with an "X" number of high order address bits and low order address bus 238 provides memory unit 210 with a "Y" number of low order address bits. Together, the high order and low order address bits specify the address at which the digital signal state presented at input 216 is to be stored when a memory strobe signal is applied to memory unit 210.

Referring to FIG. 3A, four periods of input signal 208 are illustrated. They are first period 304, second period 306, third period 308, and fourth period 310. Each period of input signal 208 is generated in response to the application of a clock pulse on clock input signal line 228 to the digital circuit under test. Thus, the first period 302 of input signal 208 is generated at the test node in response to clock pulse 312 of clock input 228. Likewise, second period 306 is generated in response to clock pulse 314, third period 308 is generated in response to clock pulse 314, and fourth period 310 is generated in response to clock pulse 318.

In a preferred application, digital signal detector 200 is used to sample the state of a series of periods of a digital signal received on input signal line 208. The total time period over which this series of input signal periods occurs is referred to as a test period. For example, referring to FIG. 3A, test period 302 is chosen to be of a duration which is equivalent to four periods 304, 306, 308, and 310 of input signal 208. In other words, with each execution of a test period, a desired number of input signal periods are generated at the test node. During a test period, a specific portion of each of these input signal periods is sampled by digital signal detector 200. Thus, if the input signal periods are divided into eight portions as illustrated in the exemplary period 320 of FIG. 3B, then eight executions of the test program (eight test periods 302) are required to completely capture all eight portions of each input signal period.

The number of high order address bits (X) must be sufficiently large such that the binary value they represent can be incremented through the number of clock pulses which occur in a given test period. Referring to the example of FIG. 3A, test period 302 has a total of four periods 304, 306, 308, and 310 during input signal 208. Thus, the number of high order bits "X" must be at least (2 since $2^X=2^2=4$). With each occurrence of a clock pulse, address determination circuit 222 increments the value of the high order address bits by one. Since these are the high order bits of the address, they serve to clock the memory unit by $2^Y$ locations. In the above example, with each increment of the high order address bit value, the resulting storage address is incremented by $2^Y=2^3=8$. This is discussed further below.

The number of low order address bits "Y" provided to memory unit 210 represents the number of memory unit storage locations which contain a single period of input signal 208. For example, referring to the example of FIG. 3A and the exemplary input signal period 320 FIG. 3B, to obtain eight samples of each input signal period, the number "Y" of low order address bits must be equal to 3, since $2^Y=2^3=8$. Each input signal period 304, 306, 308, and 310 is divided into $2^Y$ discrete increments of a time $\Delta t$ in length. Thus, number of low order address bits is related to the size of the discrete increment at which the input signal is sampled. As the duration of the $\Delta t$ increment of time decreases, the number of samples required to capture a complete input signal period increases. As the number of samples increases, the number of low order address bits increases. Referring to FIG. 3B, since each of the eight portions of each input signal period is separately captured, each period is sampled at times (0)$\Delta t$ 322, (1)$\Delta t$ 324, (2)$\Delta t$ 326, (3)$\Delta t$ 328, (4)$\Delta t$ 330, (5)$\Delta t$ 332, (6)$\Delta t$ 334, and (7)$\Delta t$ 336 from the occurrence of the associated edge of clock input 228. Thus, as discussed above, digital signal detector 200 will accumulate a complete picture of the node data in $2^Y$ or 8 test periods.

IV. Digital Signal Detector Operation

FIG. 4 illustrates the relationship between the control of memory delay circuit 214 and the selection of the memory storage location for each captured portion of the example input signal 208 shown in FIG. 3A. The operation of digital signal detector 200 is now described with reference to the example test period of FIG. 3A, exemplary input signal period of FIG. 3B, and the chart of FIG. 4.

There are seven columns and 32 rows of data provided in the chart illustrated in FIG. 4. Column 1 provides the test period in which the sampled data is obtained. Column 2 provides the sampled period of input signal 208. Column 3 is the delay in increments of $\Delta t$ from the occurrence of the associated clock pulse that the input signal period is sampled. Columns 4 and 5 provide the high and low order address bits which are provided to memory unit address input 218. Columns 6 and 7 provide the memory address for the particular sampled data in binary and decimal form.

Referring to column 1 (test period), the relationship between test period 302 and the storage of the sampled portions of input signal 208 is now described. Since there are $2^Y$ number of $\Delta t$ increments in one clock cycle, it will take $2^Y$ number of repetitions of the test program to capture all portions of the input signal periods and thus accumulate a complete picture of the node data. Thus, since Y=3 (see column 5) and the input signal periods are divided into $2^3$ or 8 portions, then 8 repetitions of the test program are required to accumulate enough sampled portions to reconstruct a complete test period of the input signal 208 illustrated in FIG. 3A. Referring to column 1, one of the eight test periods, test period 302 is shown. Since the chart of FIG. 4 is organized according to data sampling, each of the eight test programs is separated according to the input signal period. This is discussed further below.

During each test period a single portion of each of the four input signal periods (304, 306, 308, and 310) are sampled and stored in memory unit 210. The value of the low order address bits and the $\Delta t$ increment remain constant during a given test period. Thus, the same portion of each input signal period is sampled during the execution of a test period. For example, during a first test period, each of the four input signal periods 304, 306, 308, and 310 are sampled at the same point in time, (0)$\Delta t$, relative to the application of the respective clock pulse 312, 314, 316, and 318. The storage of the sampled data is illustrated in rows 1, 9, 17, and 25 of FIG. 4. Column 2 (input signal period) and column 3 (delay) show that the same portion of the four input signal periods is sampled during the first test period.

The value of the high order address (column 4) is incremented with each input signal period. This is the result of address counter 224 counting the clock pulses appearing on clock input line 228. As just mentioned, the value of the low order address (column 5) remains unchanged during the first test period. Thus, the incrementing of the high order address value increments the fourth address bit (see column 6) which results in the address incrementing $2^3=8$ locations. Thus, for the first input signal period, the sampled data is stored at memory unit 210 address 0; second period, address 8; third period, address 16; and fourth period, address 24 (see column 7, rows 1, 9, 17, and 25).

When the selected delay is (0)$\Delta t$ 322, then each period of input signal 228 is sampled at the time of the associated edge of clock input 228 (0*$\Delta t$=0 delay; see FIG. 3B). Thus, the first period of input signal 208, period 304, is sampled at clock pulse 312 (see column 3, row 1). The low order address bits are "000" (row 1, column 6). This indicates that, since this is this first portion of input signal period 304 which is sampled during the first test period, it is to be stored at the first memory location associated with that input signal period.

The input signal is sampled again with the occurrence of the next clock pulse 314. Application of clock pulse 314 results in the generation of a second input signal period 306. The second period 306 is sampled at the same point in time from clock pulse 314 as the first input signal period 304 was sampled from clock pulse 312. This is because, as discussed above, the time increment $\Delta t$ is incremented with successive test periods, not with successive input signal periods within a test period. Thus, second input signal period 306 is sampled at a delay time of (0)$\Delta t$ past clock pulse 314 (column 3, row 9). The low order address bits are again "000" (row 9, column 6). A zero low order address bit value indicates that the sampled data is to be stored at the first memory location associated with the second input signal period 306. This same approach is repeated for the remaining input signal periods in the test period. The complete address is discussed below with respect to the high order address bits.

At each successive execution of the test program, the value of the low-order address bits is incremented by one. This advances the sampling of the digital signal (which is regenerated with each test program execution) in discrete intervals. Referring to the above example, during the next (second) test period, the selected delay is incremented to (1)$\Delta t$ 324. Here, each period of input signal 228 is sampled at a time of $\Delta t$ from the associated clock pulse (1*$\Delta t=\Delta t$ seconds delay; see FIG. 3B). Thus, referring to FIG. 4, first period 304 of input signal 208 is sampled at a delay time of $\Delta t$ past clock pulse 312 during the second test period (see column 3, row 2). The low order address bits are "001" (row 2, column 6) for this sampling. This indicates that, since this is the second sampling (second test period) of input signal period 304, the sampled data is to be stored at a second memory location associated with this input signal period. This same approach is repeated for the remaining input signal periods in the test period. Thus, the second portion of the first input signal period 304 is stored at a memory location ("00001") which is adjacent to the storage location which contains the first portion of input signal period 304 (memory location "00000"). The same applies to the second sampled portion of the second input signal period 306 (row 10, column 7).

It can be seen from this example and the remainder of FIG. 4, that when the selected delay is at (0)$\Delta t$ 322, the low order address bit value is "0" (000). When the selected delay is (1)$\Delta t$, the low-order address bit value is "1" (001). When the selected delay is (n)$\Delta t$, the low-order address bit value is "n." In other words, at each sampling, the value of the low order address bits is equivalent to the number of $\Delta t$ increments at which the input signal is being sampled. In a preferred embodiment, each period of the input signal is sampled at eight $\Delta t$ increments and stored in eight consecutive locations, from $2^Y=0=$"000" to $2^Y=7=$"111."

Given the above, it becomes apparent that the total number of data samples in the above example may be determined from the product of the number of input signal periods and the number of samples per period. Thus, the chart illustrated in FIG. 4 has 32 entries (32 rows) since there are 4 input signal periods and 8 data samples per period.

In a preferred embodiment, the present invention is utilized to sample test node data of a DUT at a rate of 50 MHz (50 Mhz clock) with a memory delay of one nanosecond. In such an embodiment, the nodal data is repeatedly sampled at 50 MHz, with each sampling occurring one nanosecond later that the previous sampling. Once the required number of executions of the test program have completed, memory unit 210 contains the sampled states of input signal 208 stored in such a manner that sequentially reading the storage locations of memory unit 210 permits the recreation of input signal 208. In a preferred embodiment, the digital signal states which are scanned from memory unit 210 are then compared to an expected behavior to determine delay-type defects in the DUT.

It should be noted that the increments of time at which the input signal is sampled is determined by the type of performance error which may need to be identified. For example, the present invention may be implemented in a circuit tester which is configured to detect spikes in a digital signal. However, the present invention may not capture a signal spike which has a duration which is less that the minimum sample time $\Delta t$. Thus, in the example described above, if the input signal has a spike which maintains a value above the high threshold for less than one nanosecond, then the spike would not be by the present invention. In other words, the input signal must cross at least one of the high or low threshold values for a duration sufficiently long to be clocked into memory unit 210.

IV. System Environment

Figure 5:
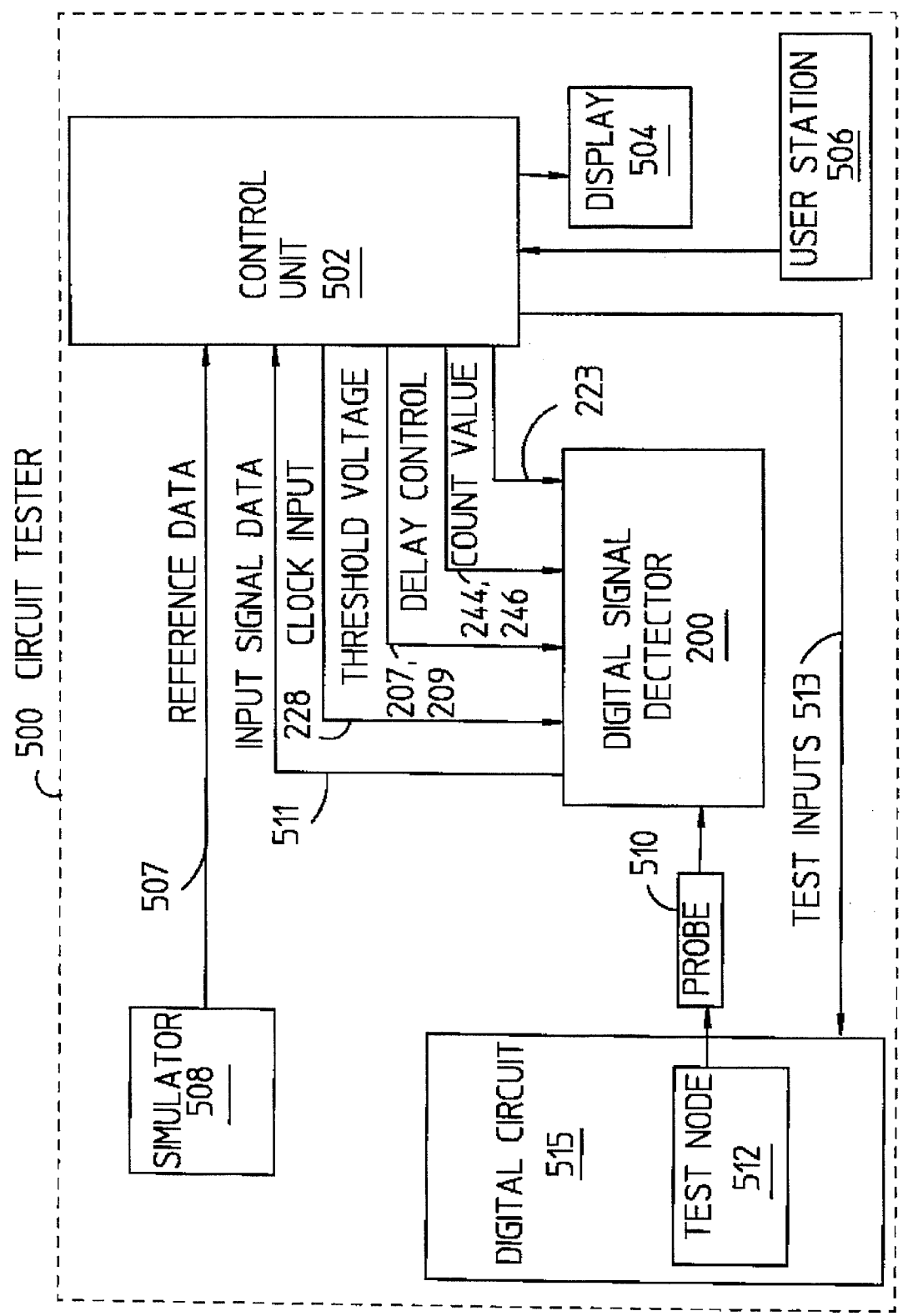
FIG. 5 is a block diagram of the digital signal detector of the present invention implemented in a circuit tester.

FIG. 5 illustrates a circuit tester 500 in which the digital signal detector of the present invention is implemented. In a preferred embodiment of the present invention, the circuit tester 500 in which digital signal detector 200 is integrated is a high speed chip tester, known as the Hewlett Packard HP 82000 Multi-Chip Module (MCM) Tester, available from Hewlett Packard, Loveland, Colo., U.S.A. In another preferred embodiment of the present invention, circuit tester 500 is a Hewlett Packard HP 3070 Board Tester, also available from Hewlett Packard, Loveland, Colo.

Referring to FIG. 5, circuit tester 500 includes a control unit 502 which controls the timing and operation of circuit tester 500. Control unit 502 includes a processor and associated circuitry which includes data storage capabilities. As would be apparent to one of ordinary skill in the relevant art, the processor may be any known processor now or later developed.

In a preferred embodiment of the present invention, tester 500 interfaces with a simulator 508. Simulator 508 provides reference data representing the expected behavior of test node 512 to control unit 502 via reference data line 507. Typically, the simulation of digital circuit 515 is performed prior to (and independently of) the testing of digital circuit 513. The results of the simulation are then provided to control unit 502 in what is referred to as a simulation log file. The simulation log file contains threshold crossings and timing reference data for the test node 512 based upon the application of a given set of test inputs 513 to digital circuit 515. In the preferred embodiment of the present invention, simulator 508 is a Mentor Graphics QuickSira simulator, available from Mentor Graphics, Beaverton, Oreg., U.S.A. However, as on or ordinary skill in the relevant art would find apparent, the present invention may be implemented to interface with any simulator which generates a simulation log file containing the required threshold crossing and timing reference data.

In those applications wherein a simulator is not utilized to generate the reference data, engineering models of the DUT are often employed. The engineering models generate a library file containing timing (threshold crossings) and "trace and when" (dependencies and conditions) information. In such applications, circuit tester 500 is configured to retrieve the reference data from the library file. This library file can be stored in any known or later developed data storage system compatible with control unit 502. The reference library can also be incorporated into the associated memory of control unit 502.

Digital circuit 515 generates a digital signal at test node 512 as a result of the application of test inputs 513. The digital signal is provided to digital signal detector 200 via probe 510. Digital signal detector 200 then operates as described above to capture the state of the input digital signal 208. Digital signal detector 200 captures the state of a digital signal at discrete intervals in time and stores the captured digital signal states for eventual analysis of delay-type faults, such as performance faults. In a preferred embodiment, digital circuit 515 exhibits the same behavior with repeated applications of the same test inputs 513. In other words, digital circuit 515 and its components do not have defects which cause digital circuit 515 to behave in an intermittent manner.

In a preferred embodiment of the present invention, a known set of test inputs 513 are applied to test circuit 512 by executing a test program in control unit 502 which controls both, digital circuit 515 and digital signal detector 200. As discussed above, control unit 502 controls digital signal detector 200 via clock input 228, threshold voltages 207,209 and delay control lines 244,246.

It will be apparent to one of ordinary skill in the relevant art that some or all of the operations performed by the simulator 508, control unit 502, and digital signal detector 200 may be incorporated into a single microprocessor, and may be embodied in a single semiconductor chip, or in a series of such chips.

In a preferred embodiment, circuit tester 500 receives input signal 208 from a probe 510. Probe 510 couples digital signal detector 200 with the test circuit 512. In a preferred embodiment of the present invention, the probe has a bandwidth which is greater than the input signal which is being sampled.

A user station 506 such as a keyboard can be connected to the control unit 502 in order to access the control unit. By entering a sequence of keystrokes, various operations can be performed. The control unit 502 is also connected to a display 504 such as, for example, an LCD or a CRT display. Thus, the user, at any desired time, by interfacing through user station 506 with the control unit 502, may display the reference data, input signal, or the results of the analysis, including performance faults or other propagation delay type defects.

The characters displayed on display 504 may, for example, comprise a collection of numbers showing separately the number and type of threshold faults, the number characteristics of performance faults, or any combination or sequence thereof. By entering a sequence of keystrokes on user station 506, the user may also program control unit 502 to perform a wide variety of functions. In addition, because control unit 502 is programmable, a computer programmer skilled in the relevant art can implement a wide variety of operations. For example, in a preferred embodiment, control unit 502 may be configured to collect and store the sampled digital signal in local memory, compare the timing of edges between saved signal levels, to synchronize the occurrence of a saved edge with a specific point in real time (calibration), compare a saved signal state against a simulated state (for pass/fail information and analysis of failure modes, if any). Preferably, control unit 502 also has the capability to save multiple digital signals for analysis.

In summary, the present invention provides a digital signal detector which samples and stores a digital signal state at predetermined intervals. The present invention comprises circuits that can substantially continuously test for the existence of performance faults and provide the digital signal levels to circuits subsequent thereto. The fault data can then be viewed by the user, stored in a large memory system, processed in some manner, or otherwise used as desired, such as to trigger another device.

Although the invention has been described and illustrated with a certain degree of particularity, it is understood that those of ordinary skill in the relevant art will recognize a variety of additional applications and appropriate modifications within the spirit of the invention and the scope of the claims.

What is claimed is:

1. A digital signal detector for sampling, with high resolution, an input digital signal for a plurality of test periods, wherein successive samples of the input digital signal are stored, at predetermined delay periods, for each of the plurality of test periods and performing a post sampling evaluation of the input digital signal, the input digital signal having periodically repetitive signal characteristics, the digital signal detector comprising:

a state discriminator to determine a state of the input digital signal, said state indicating a voltage level of the input digital signal relative to one or more threshold voltages, wherein said state discriminator generates one or more signal state outputs corresponding to said one or more threshold voltages, respectively, each of said one or more signal state outputs indicating a relation of said input digital signal voltage level to a corresponding one of said one or more threshold voltages;

a memory delay control circuit to receive a clock signal having clock pulses and to generate a memory strobe signal by delaying said clock pulses by zero or more the predetermined delay periods for successive applications of said clock, wherein each of said successive applications of said clock constitutes one of the plurality of test periods; and a memory unit, electrically coupled to said state discriminator and said memory delay control circuit, to receive said one or more signal state outputs and said memory strobe signal, wherein said memory unit stores a predetermined number of successive samples of one or more signal state outputs, for each of the plurality of test periods, upon receipt of said memory strobe signal output by said memory delay control unit, thereby achieving high sample resolution;

wherein said predetermined number of successive samples of said one or more signal state outputs are stored at memory locations of said memory unit identified by an address command such that said stored predetermined number of successive samples of said one or more signal state outputs can be retrieved from said memory unit for the post sampling evaluation of the input digital signal.

2. The digital signal detector of claim 1, wherein said one or more signal state outputs together provide a continual indication of said state of the input digital signal.

3. The digital signal detector of claim 1, wherein said state discriminator comprises one or more comparators, each of said one or more comparators determining said relation of said input digital signal voltage level to said corresponding one of said one or more threshold voltages, each of said one or more comparators coupled to the input digital signal and said corresponding one of said one or more threshold voltages.

4. The digital signal detector of claim 1, wherein said state of the input digital signal is any one of a high voltage state, a low voltage state, and an intermediate voltage state.

5. The digital signal detector of claim 1, wherein said address command comprises:

high order address bits having a high order address bit value, said high order address bit value incrementing with each of said clock pulses occurring in each of the plurality of test periods, each of the plurality of test periods including one or more periods of the input digital signal, each of said clock pulses causing one of said input digital signal periods to occur; and low order address bits having a low order address bit value, said low order address bit value incrementing with each occurrence of each of the plurality of test periods.

6. The digital signal detector of claim 5, wherein said high order address bit value is determined by an address determination circuit, and further wherein said low order address bit value is controlled external to the digital signal detector.

7. The digital signal detector of claim 6, wherein said address determination circuit comprising an address counter configured to receive said clock input, said address counter incrementing said high order address bit value with each occurrence of said clock pulse.

8. A digital signal detector for sampling an input digital signal and performing a post sampling evaluation of the input digital signal, the input digital signal having periodically repetitive signal characteristics, the digital signal detector comprising:

a state discriminator to determine a state of the input digital signal, said state indicating a voltage level of the input digital signal relative to one or more threshold voltages, wherein said state discriminator generates one or more signal state outputs corresponding to said one or more threshold voltages, respectively, each of said one or more signal state outputs indicating a relation of said input digital signal voltage level to a corresponding one of said one or more threshold voltages;

a memory delay control circuit to receive a clock signal having clock pulses and to generate a memory strobe signal by delaying said clock pulses by zero or more delay periods, wherein said memory delay control circuit comprises a micro delay unit configured to generate a first increment of time according to a first command input and a macro delay unit, coupled to said micro delay unit, configured to generate a second increment of time, larger that said first increment of time, according to a second command input, wherein said first increment of time and said second increment of time are summed to result in a delay time period; and a memory unit, electrically coupled to said state discriminator and said memory delay control circuit, to receive said one or more signal state outputs and said memory strobe signal, wherein said memory unit stores a portion of said one or more signal state outputs upon receipt of said memory strobe signal output by said memory delay control unit, wherein said portions of said one or more signal state outputs are stored at memory locations of said memory unit identified by an address command such that said stored portions of said one or more signal state outputs can be retrieved from said memory unit for evaluation of the input digital signal, and wherein said address command comprises high order address bits having a high order address bit value, said high order address bit value incrementing with each of said clock pulses occurring in a test period, said test period including one or more periods of the input digital signal, each of said clock pulses causing one of said input digital signal periods to occur and low order address bits having a low order address bit value, said low order address bit value incrementing with each occurrence of said test period.

9. A circuit tester with high sample resolution for determining performance faults in a digital circuit under test, comprising:

a digital signal detector for sampling and storing an input digital signal occurring at a test node on the digital circuit under test for a plurality of test periods, wherein successive samples of said input digital signal are stored, at predetermined delay periods, for each of said plurality of test periods and performing a post sampling evaluation of said input digital signal by the circuit tester, said input digital signal having periodically repetitive signal characteristics, the digital signal detector comprising:

a state discriminator to determine a state of the input digital signal, said state indicating a voltage level of the input digital signal relative to one or more threshold voltages, wherein said state discriminator generates one or more signal state outputs corresponding to said one or more threshold voltages, respectively, each of said one or more signal state outputs indicating a relation of said input digital signal voltage level to a corresponding one of said one or more threshold voltages, a memory delay control circuit to receive a clock signal having clock pulses and to generate a memory strobe signal by delaying said clock pulses by zero or more said predetermined delay periods for successive applications of said clock, wherein each of said successive applications of said clock constitutes one of said plurality of test periods, and a memory unit, electrically coupled to said state discriminator and said memory delay control circuit, to receive said one or more signal state outputs, said memory strobe signal, and an address command, wherein said memory unit stores a predetermined number of successive samples of said one or more signal state outputs, for each of said plurality of test periods, upon receipt of said memory strobe signal at a memory location indicated by said address command, thereby achieving high sample resolution;

reference means for generating reference data representing the expected behavior of said test node; and a control unit for controlling said digital signal detector and for preforming said post sampling evaluation, including comparing said reference data with said one or more signal state outputs retrieved from said memory unit to determine the existence of performance faults.

10. The circuit tester of claim 9, wherein said one or more signal state outputs together provide a continual indication of said state of said input digital signal.

11. The circuit tester of claim 10, wherein said state discriminator comprises one or more comparators, each of said one or more comparators determining said relation of said input digital signal voltage level to said corresponding one of said one or more threshold voltages, each of said one or more comparators coupled to said input digital signal and said corresponding one or more threshold voltages.

12. The circuit tester of claim 11, wherein said state of the input digital signal is any one of a high voltage state, a low voltage state, and an intermediate voltage state.

13. The circuit tester of claim 9, wherein said address command comprises:

high order address bits having a high order address bit value, said high order address bit value incrementing with each of said clock pulses occurring in each of said plurality of test periods, each of said plurality of test periods including one or more periods of the input digital signal, each of said clock pulses causing one of said input digital signal periods to occur; and low order address bits having a low order address bit value, said low order address bit value incrementing with each occurrence of each of said plurality of test periods.

14. The circuit tester of claim 13, wherein said high order address bit value is determined by an address determination circuit, and further wherein said low order address bit value is controlled external to the circuit tester.

15. The circuit tester of claim 13, wherein said address determination circuit comprising an address counter configured to receive said clock input, said address counter incrementing said high order address bit value with each occurrence of said clock pulse.

16. A circuit tester for determining performance faults in a digital circuit under test, comprising:

a digital signal detector for sampling and storing an input digital signal occurring at a test node on the digital circuit under test arid performing a post sampling evaluation of said input digital signal by the circuit tester, said input digital signal having periodically repetitive signal characteristics, the digital signal detector comprising:

a state discriminator to determine a state of the input digital signal, said state indicating a voltage level of the input digital signal relative to one or more threshold voltages, wherein said state discriminator generates one or more signal state outputs corresponding to said one or more threshold voltages, respectively, each of said one or more signal state outputs indicating a relation of said input digital signal voltage level to a corresponding one of said one or more threshold voltages;

a memory delay control circuit to receive a clock signal having clock pulses and to generate a memory strobe signal by delaying said clock pulses by zero or more delay periods, wherein said memory delay control circuit comprises a micro delay unit configured to generate a first increment of time according to a first command input and a macro delay unit, coupled to said micro delay unit, configured to generate a second increment of time, larger than said first increment of time, according to a second command input, wherein said first increment of time and said second increment of time are summed to result in a delay time period; and a memory unit, electrically coupled to said state discriminator and said memory delay control circuit, to receive said one or more signal state outputs, said memory strobe signal, and an address command, wherein said memory unit stores a portion of said one or more signal state outputs upon receipt of said memory strobe signal at a memory location indicated by said address command, said address command comprises high order address bits having a high order address bit value, said high order address bit value incrementing with each of said clock pulses occurring in a test period, said test period including one or more periods of the input digital signal, each of said clock pulses causing one of said input digital signal periods to occur, and low order address bits having a low order address bit value, and said low order address bit value incrementing with each occurrence of said test period, said high order address bit value is determined by an address determination circuit and said low order address bit value is controlled external to the circuit tester;

reference means for generating reference data representing the expected behavior of said test node; and a control unit for controlling said digital signal detector and for comparing said reference data with said one or more signal state outputs retrieved from said memory unit to determine the existence of performance faults.

17. In a circuit tester, a method for determining the occurrence of performance faults in a digital circuit having periodically repetitive signal characteristics, the circuit tester having a digital signal detector and a control unit coupled to the digital signal detector, the method comprising the steps of:

a) applying a predetermined set of test signal inputs to the digital circuit;

b) applying a clock signal to the digital circuit and to the digital signal detector electrically coupled to a test node of the digital circuit, said clock signal causing the occurrence of a period of the digital signal at said test node;

c) in a state determination circuit electrically coupled to said test node, continually determining the state of the digital signal period occurring at said test node;

d) determining a storage location in a memory unit at which to store a predetermined number of successive samples of said digital signal period state, said predetermined number of successive samples comprising said digital signal period, each of said predetermined number of successive samples occurring at said test node at a successive increment of time from said application of said clock pulse to the digital circuit;

e) applying a memory strobe to said memory unit by an amount of delay time after said step b), said amount of delay time corresponding to said each of said predetermined number of successive samples of said digital signal period states; and f) storing one of said predetermined number of successive samples of said digital signal period state at said storage location of said memory unit upon receipt of said memory strobe by said memory unit.

18. In a circuit tester, a method for determining the occurrence of performance faults in a digital circuit having periodically repetitive signal characteristics, the circuit tester having a digital signal detector and a control unit coupled to the digital signal detector, the method comprising the steps of:

applying a predetermined set of test signal inputs to the digital circuit;

applying a clock signal to the digital circuit and to the digital signal detector electrically coupled to a test node of the digital circuit, said clock signal causing the occurrence of a period of the digital signal at said test node;

in a state determination circuit electrically coupled to said test node, continually determining the state of the digital signal period occurring at said test node;

d) determining a storage location in a memory unit at which to store a predetermined number of successive samples of said digital signal period state, said predetermined number of successive samples comprising said digital signal period, each of said predetermined number of successive samples occurring at said test node at a successive increment of time from said application of said clock pulse to the digital circuit;

e) applying a memory strobe to said memory unit by an amount of delay time after said step b), said amount of delay time corresponding to said each of said predetermined number of successive samples of said digital signal period states;

f) storing one of said predetermined number of successive samples of said digital signal period state at said storage location of said memory unit upon receipt of said memory strobe by said memory unit;

g) repeating steps a) through f) for a predetermined number of digital signal periods, said predetermined number of digital signal periods comprising a test period; and h) repeating step g) for a predetermined number of test periods, wherein said amount of delay time corresponding to said each of said predetermined number of successive samples of said digital signal period states is incremented with each successive test period.

19. The method of claim 18, further comprising the steps of:

i) receiving reference data representative of an acceptable digital signal for said applied test signal inputs and said test node;

j) retrieving said digital signal period states from said memory unit; and k) comparing said retrieved digital signal period states with said reference data.

20. The method of claim 19, wherein said digital signal period state determined by said state discriminator indicates a voltage level of said input digital signal relative to one or more threshold voltages, the method further comprising the steps of:

in said state discriminator, generating one or more signal state outputs corresponding to said one or more threshold voltages, respectively, each of said one or more signal state outputs indicating a relation of said input digital signal voltage level to said corresponding threshold voltage.

* * * * *